(12) United States Patent
Wang

(10) Patent No.: US 6,229,406 B1
(45) Date of Patent: May 8, 2001

(54) OSCILLATOR CIRCUIT HAVING MAXIMIZED SIGNAL POWER AND REDUCED PHASE NOISE

(75) Inventor: Hongmo Wang, Watchung, NJ (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/409,150

(22) Filed: Sep. 30, 1999

(51) Int. Cl.$^7$ ....................................... H03B 5/12
(52) U.S. Cl. .................. 331/117 FE; 331/46; 331/177 V
(58) Field of Search .......................... 331/117 FE, 117 R, 331/112, 113 R, 114, 177 V, 46, 56

(56) References Cited

U.S. PATENT DOCUMENTS 4,419,634 * 12/1983 Druegh et al. .................... 331/117 R
4,454,485 * 6/1984 Fisher ............................. 331/117 FE
4,596,966 * 6/1986 Derewonko et al. ........... 331/117 FE

* cited by examiner

Primary Examiner—Siegfried H. Grimm

(57) ABSTRACT

An oscillator circuit for increasing the signal power of a generated oscillating signal while decreasing phase noise. The circuit includes an oscillating stage having an inductor and capacitors for producing a periodic oscillating signal and a first control signal. An active stage having a transistor with a gate terminal, a source terminal and a drain terminal is connected to the oscillating stage so that the first control signal is provided to the source terminal of the transistor. A second control signal is provided to the transistor gate terminal for increasing the voltage applied to the gate terminal when the first control signal decreases the voltage applied to the source terminal, thus controlling the activation of the transistor for supplying signal boosting power to the tank stage.

15 Claims, 3 Drawing Sheets

OSCILLATOR CIRCUIT HAVING MAXIMIZED SIGNAL POWER AND REDUCED PHASE NOISE

BACKGROUND OF THE INVENTION

1. Field of the Invention

The present invention pertains to an improved oscillator circuit having increased signal power.

2. Description of the Related Art

Oscillator circuits include a tank section having one or more inductance and capacitance elements which cause signal oscillation. All tank circuits inherently exhibit losses that are caused, for example, by resistance in the inductance elements. Such losses result in attenuation or decay over time of an oscillated output signal. In each oscillator signal cycle, a maximum of the losses coincides with the maximum value of the oscillated output signal, i.e. the maximum amplitude of the oscillated signal. To combat this problem, an active stage is included in oscillator circuits to compensate for signal decay by adding energy to the tank. A problem with such an approach, however, is that the DC power consumed by the circuit is usually much greater than the signal power it produces. And, as discovered by the inventor recently, to produce more signal power from a given amount of DC power, it is necessary to replenish the energy into the tank in as narrow a pulse as possible.

A known and widely used oscillator circuit suffering from the drawbacks discussed above is the Colpitts oscillator 10 shown in FIG. 1 which provides single-ended oscillation especially when the losses in the tank are large or the quality factor is small. This oscillator includes a tank stage having an inductor L and a capacitor pair $C_1$, $C_2$, driven by a power replenishing stage having a transistor Q and a DC current source 12 which draws a constant current I. As shown, capacitors $C_1$, $C_2$ are connected at a node $N_1$ which is located at the source terminal of the transistor Q where a voltage $V_1$ is present. Capacitor $C_1$ is connected to inductor L at a node $N_2$, at which a voltage $V_2$ is present. The power supply V, bias voltage $V_B$ and DC current source 12 provide proper bias condition for the transistor Q. Voltage $V_2$ represents the oscillated output signal of circuit 10.

When the tank stage begins to oscillate, the value in signal $V_2$ increases and decreases periodically around its quiescent point V. The signal $V_1$ is basically a voltage divided value of signal $V_2$ between capacitor $C_1$ and $C_2$ and thus, also varies around its quiescent point. As signals $V_2$ and $V_1$ increase, the transistor Q—which has a turn-on or threshold voltage $V_{TH}$—will be turned off because the voltage between the gate and source terminals ($V_{gs}$) decreases below the value of $V_{TH}$. As a result, and because capacitor $C_1$ resembles an open-circuit condition for a DC current, the current I required by the current source 12 is provided through the discharge of capacitor $C_2$. As oscillation continues, this causes the values of $V_1$ and $V_2$ to decrease until the voltage $V_{gs}$ exceeds $V_{TH}$. At this point, transistor Q turns on to provide current to current source 12 and to recharge capacitor $C_2$. Consequently, the signals $V_1$ and $V_2$ increase again.

A drawback of the prior art circuit 10 of FIG. 1 is that the conduction duration of the transistor is dictated by a single control signal namely, $V_1$, which is related to the output signal $V_2$ through the ratio of $C_1$ and $C_2$. The choice of $C_2$ thus serves dual diametrically opposing functions. In particular, $C_2$ needs to be small in order to produce a large variation in signal $V_1$ to turn the transistor on and off in as short a duration as possible. On the other hand, $C_2$ needs to be large in order to provide the current drawn by the current source 12 in as long a duration as possible. The limitation on the duration of transistor conduction resulting from this dilemma restricts the capabilities of the prior art circuit for attaining an increased signal power and, consequently, an increased frequency stability.

SUMMARY OF THE INVENTION

An oscillator circuit is provided for attaining increased oscillator signal power and increased frequency stability. The inventive circuit contains a tank stage having an inductor and at least a pair of capacitors for producing an oscillated signal. An active stage is electrically connected to the tank stage for injecting power to the tank stage to compensate for the losses that occur in the tank. The active stage includes a transistor having a gate terminal, a source terminal and a drain terminal. A supply voltage V, a bias voltage $V_B$ and a DC current source are connected to the active stage to provide a proper bias condition. The capacitors are also connected to the source terminal to provide a first control signal to the source terminal for selectively activating the transistor when a voltage between the gate and source terminals exceeds a threshold voltage value of the transistor. Means for producing a second control signal and for providing the second control signal to the gate terminal is provided for insuring that the transistor can be turned on and off in as short a duration as possible.

In a preferred embodiment, the control means includes a second inductor electromagnetically coupled to the first inductor for producing the second control signal when current flows through the first inductor.

In another preferred embodiment, a differential oscillator circuit is provided that exhibits improved oscillating signal power. The differential circuit includes two circuit branches, with each branch containing a tank stage and an active stage configured in a cross coupled arrangement wherein the oscillating signals produced by each tank stage are provided to the respective gate terminals of the transistors of the other active stage. In this manner, each oscillating signal from each tank stage operates as the second control signal for the transistor in the other stage.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

A goal in oscillator circuit design is to achieve as high a frequency stability as possible. Frequency stability is often expressed in the phase noise measured in a particular oscillator circuit. A reduced phase noise will yield increased frequency stability. Phase noise, which is defined as the ratio of noise power to signal power, can be reduced by increasing the signal power of an oscillating signal. The inventor has discovered that in a given oscillator circuit, such as the prior art circuit 10 discussed above, the length of time or duration that transistor Q is activated affects the signal power. In particular, the inventor has found that by minimizing the duration of transistor conduction, the signal power of the oscillating signal can be maximized, resulting in reduced phase noise and, consequently, improved frequency stability.

Figure 1:
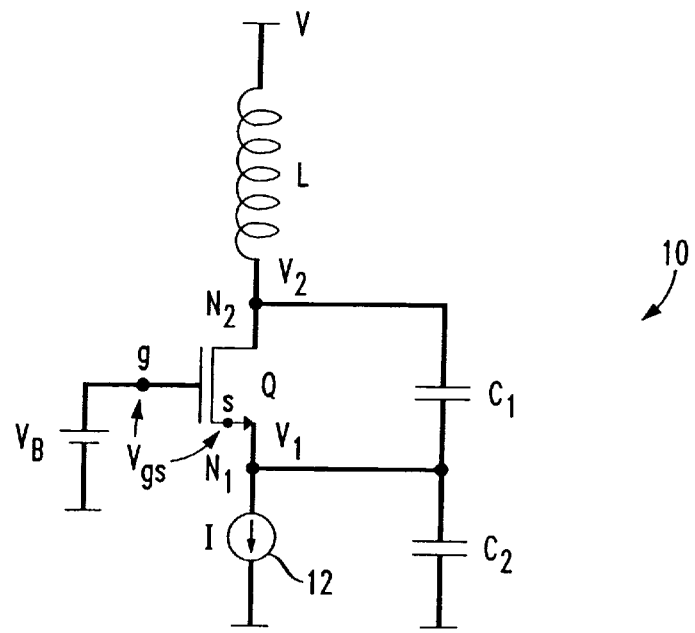
FIG. 1 is a schematic representation of a prior art oscillator circuit.
Figure 2:
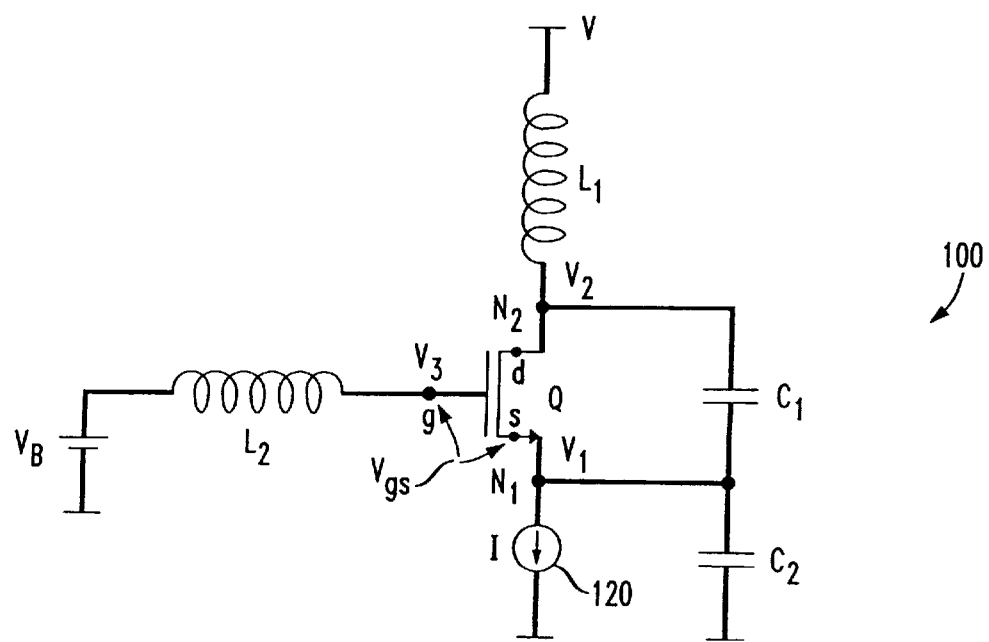
FIG. 2 is a schematic representation of an oscillator circuit constructed in accordance with a preferred embodiment of the present invention.

Utilizing this principle, a single-ended oscillator circuit 100 in accordance with a currently preferred embodiment of the present invention is schematically depicted in FIG. 2. Like the prior art circuit 10 of FIG. 1, circuit 100 includes a tank stage having an inductor L and a pair of capacitors $C_1$, $C_2$. To compensate for the loss in the tank stage, an active stage is used including a transistor Q having a gate, a drain and a source terminal. A DC supply voltage V, a DC bias voltage $V_B$ and a DC current source 120 are provided to set proper bias conditions for the transistor. Circuit 100 produces an oscillating output signal $V_2$ which is present at node $N_2$, formed between the drain terminal of the transistor, capacitor $C_1$ and inductor $L_1$. Capacitor $C_1$ and $C_2$ are connected to each other, as shown, and to the source terminal of the transistor Q at a node $N_1$ at which a signal $V_1$ is present. As explained more fully below, a means for controlling transistor Q is also provided. In a preferred embodiment the control means includes a second inductor $L_2$ which is electromagnetically coupled to the inductor $L_1$ and which is connected between the transistor gate terminal and the bias voltage $V_B$.

Figure 3A:
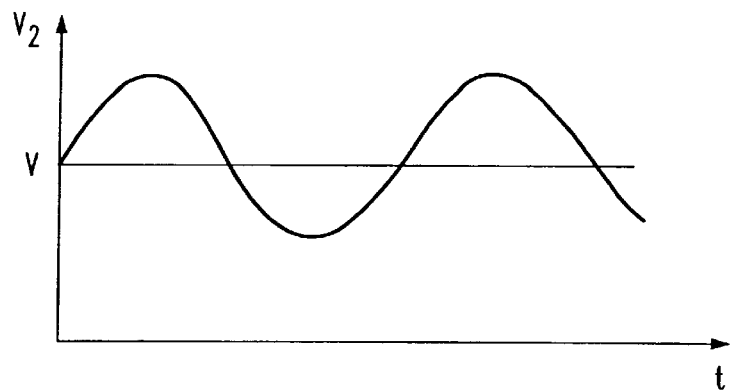
FIGS. 3a–d are graphical representations of waveforms for voltages generated by the circuit of FIG. 2.
Figure 3B:
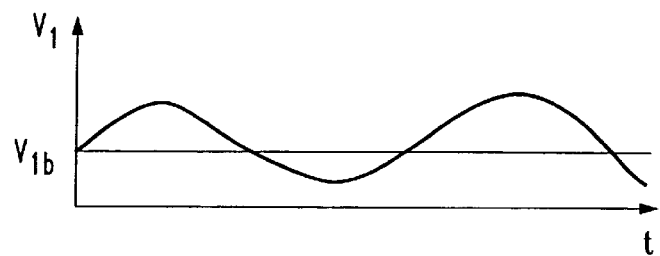

In the illustrated circuit 100, transistor Q is preferably an n-channel FET having a threshold voltage value $V_{TH}$. As is known in the art, such a device turns "on" or conducts when the voltage between the gate and source terminals ($V_{gs}$) exceeds the threshold voltage $V_{TH}$. As explained above in connection with the operation of prior art circuit 10, during oscillation an oscillated output signal $V_2$ is produced at node $N_2$ in a form depicted, for example, in FIG. 3a and having a periodic phase with an amplitude centered around a DC voltage V. As the value of $V_2$ decreases, the value of signal $V_1$ for providing control of transistor Q also decreases. Signal $V_1$ follows signal $V_2$, as shown in FIG. 3b, but at a reduced amplitude and is centered at a quiescent voltage designated in FIG. 3b as $V_{1b}$.

Figure 3C:
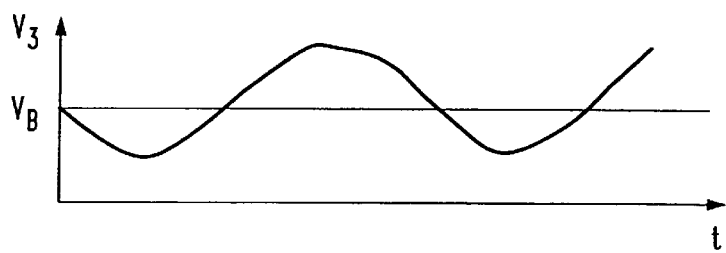
Figure 3D:
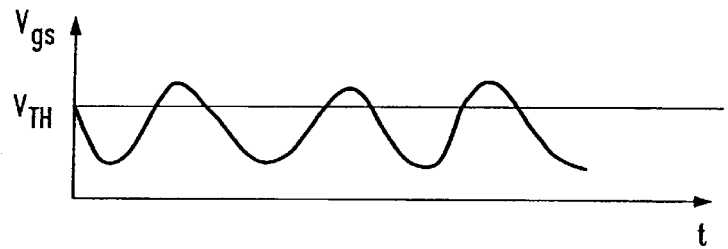

Unlike the prior art circuit 10 wherein the transistor Q is controlled solely by the value of signal $V_1$—such as when the value of $V_1$ causes the voltage $V_{gs}$ to exceed the threshold voltage $V_{TH}$ to activate the transistor—the transistor Q in circuit 100 is additionally controlled by a second control signal $V_3$ that is applied to the gate terminal of the transistor. Signal $V_3$ is preferably produced in inductor $L_2$ through the electromagnetic coupling with inductor $L_1$ and is, therefore, dependent upon the conduction in inductor $L_1$. As such, when signal $V_2$ decreases during the oscillation cycle, the value of signal $V_3$ increases. This is shown in FIG. 3c which depicts signal $V_3$ as having the opposite polarity of signal $V_2$ but sharing a common period. As shown, signal $V_3$ is centered at the DC voltage value $V_B$. Because control signal $V_1$ decreases when signal $V_2$ decreases for the reasons explained above, the simultaneous increase in the value of signal $V_3$ results in an increased value of voltage $V_{gs}$ above the $V_{gs}$ value existing absent the transistor control means, e.g. absent the second inductor $L_2$. In other words, transistor Q is now controlled by a signal applied to the gate terminal ($V_3$) and the source terminal ($V_1$), as opposed to only the control signal ($V_1$) applied to the source terminal as in the prior art circuit 10. When signal $V_2$ increases, second control signal $V_3$ decreases and first control signal $V_1$ increases, thus causing voltage $V_{gs}$ (the difference between $V_3$ and $V_1$) to fall more rapidly below the threshold voltage $V_{TH}$ and turn off transistor Q. In this manner voltage $V_{gs}$ can exceed and fall below the threshold voltage $V_{TH}$ abruptly to cause a swift turn-on and turn-off of transistor Q. This allows, through proper setting of $V_B$, a periodic supply of power to be provided to the tank stage in a minimized duration to maximize the oscillating output signal, i.e. to maximize the signal power. In other words, and as shown in FIG. 3d, the peak of voltage $V_{gs}$ alone can be adjusted to exceed the threshold voltage $V_{TH}$ for only an instant during each period which coincides with the maximum peak of the oscillating signal.

Figure 4:
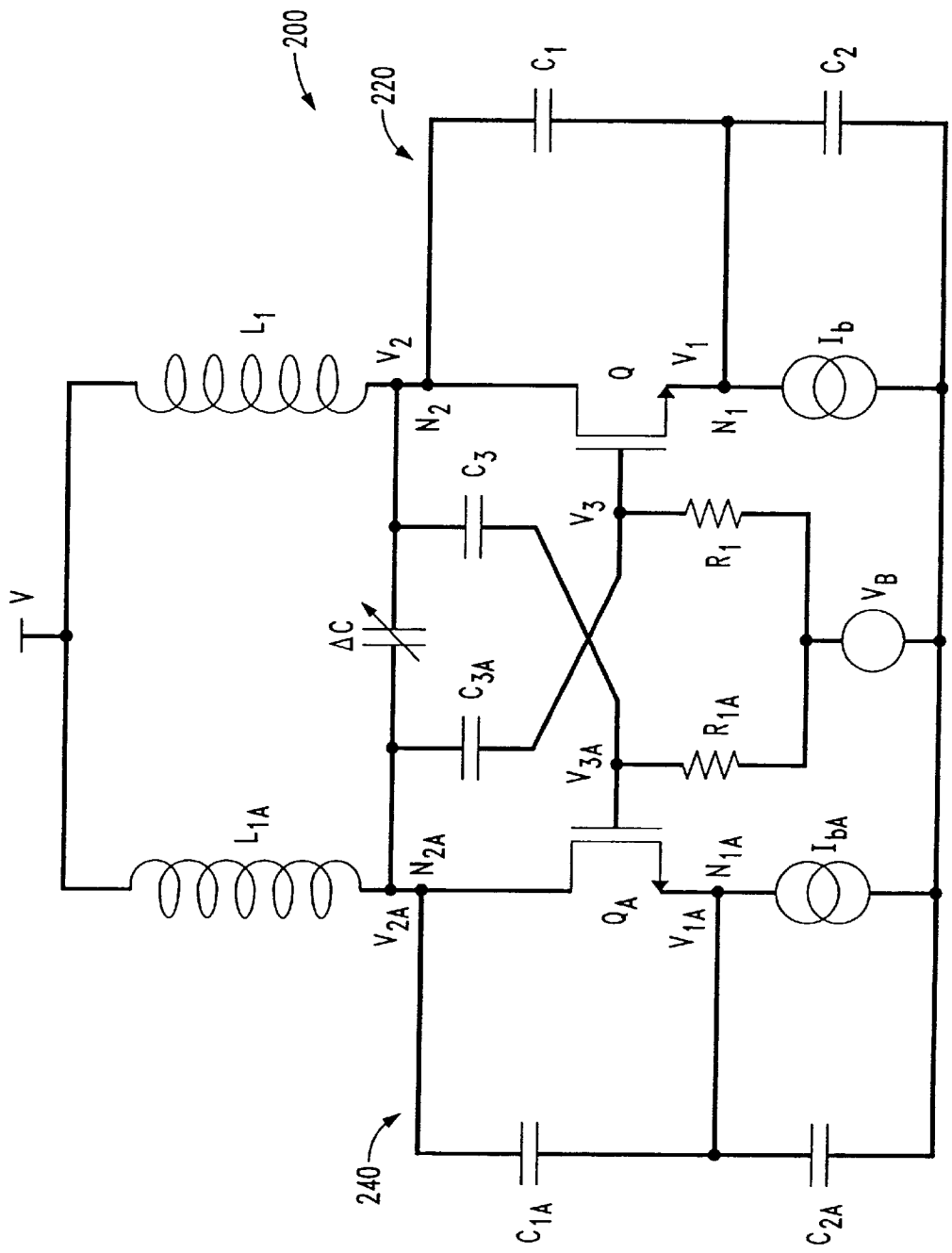
FIG. 4 is a schematic representation of another embodiment of an oscillator circuit of the present invention.

The inventive concept upon which circuit 100 is based can also be used to construct a differential oscillator circuit, such as that shown in FIG. 4 and identified by the general reference numeral 200 in accordance with another preferred embodiment. Differential oscillator circuit 200 is essentially formed of two separate and identical single band oscillator circuit sections 220, 240, each of which is similar in operation to circuit 100 discussed above. To facilitate the following description, the components and parameters of circuit section 240 contain the designation "A". The differential output signals are designated as signals $V_2$ and $V_{2A}$ which produce one of two control signals used to activate the transistors Q and $Q_A$, respectively. In particular, transistor Q is controlled by signals $V_1$ and $V_3$, and transistor $Q_A$ is controlled by signals $V_{1A}$ and $V_{3A}$. Each transistor is biased by a DC voltage supplied through a respective resistor $R_1$, $R_{1A}$. A means for controlling the values of the control signals $V_3$ and $V_{3A}$ is provided by a cross-coupled connection of the output signals from the respective circuit sections. For example, signal $V_3$ is tied to output signal $V_{2A}$ from section 240 which is applied through a capacitor $C_{3A}$ to the gate terminal of transistor Q, and signal $V_{3A}$ is tied to output signal $V_2$ from section 220 which is applied through a capacitor $C_3$ to the gate terminal of transistor $Q_A$. As is known in the art, capacitors $C_3$ and $C_{3A}$ represent short circuits for AC conditions, such as for the signals $V_2$ and $V_{2A}$. Thus, the output AC signals are essentially provided directly to the gate terminals of the transistors.

Due to the differential design of circuit 200, when signal $V_2$ decreases, signal $V_{2A}$ increases and vice versa. In operation, when signal $V_2$ decreases, signal $V_1$ also decreases as a result of the voltage divider configuration provided by the arrangement of capacitors $C_1$ and $C_2$. Simultaneously, signal $V_{2A}$ increases which causes control signal $V_3$ to increase and yields a large value of $V_{gs}$ for transistor Q. Assuming appropriate selection of the value for $V_B$, the large value of $V_{gs}$ will exceed the transistor Q threshold voltage $V_{TH}$ and thus cause transistor Q to activate for a very brief moment in each period thereby producing a maximized output signal $V_2$ and a minimized phase noise. As signal $V_2$ increases, the opposite result occurs, namely, transistor $Q_A$ is activated for a brief period while transistor Q shuts off. In the operation of either circuit 100 or 200, it is a goal to activate each transistor for only an instant of time. As explained above, this is accomplished through appropriate selection and control of the relative voltage values of the voltage source $V_B$ and the transistor threshold voltages. As a result, the peak of the output signal and the minimum of the voltage drop across the transistor ($V_{ds}$) will coincide with the instant of time the transistors are activated. This results in a minimized power consumption on the transistor and, due to the law of energy conservation, a maximized signal power.

In another preferred embodiment, a tuning element such as a varactor ΔC is included (as shown in FIG. 4) between output nodes $N_2$ and $N_{2A}$ to provide selective tuning of the differential output signal frequencies. The varactor can also be included in the circuit of FIG. 2 for selective tuning of the output signal frequency by connecting the varactor between node $N_2$ and ground.

Thus, while there have shown and described and pointed out fundamental novel features of the invention as applied to preferred embodiments thereof, it will be appreciated and understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An oscillator circuit for producing a periodic oscillating signal having increased signal power and reduced phase noise, comprising:

a transistor having a gate terminal, a source terminal, a drain terminal and a first threshold voltage value and being selectively activatable when a voltage difference between said gate and source terminals exceeds said first threshold voltage value;

a DC current source connected to said source terminal for providing bias to said circuit;

a tank section having an inductor and first and second capacitors, said first and second capacitors being connected to each other and to said source terminal for supplying a first control signal to said source terminal; and means for supplying a second control signal to said gate terminal, said means being configured for causing said second control signal to be at a high value when said first control signal is at a low value for activating said transistor for a short time duration to inject power into said tank section.

2. The circuit of claim 1, wherein said inductor comprises a first inductor and wherein said supplying means comprises a second inductor connected to said gate terminal and electromagnetically coupled to said first inductor.

3. The circuit of claim 1, wherein said second capacitor has a larger capacitance than said first capacitor.

4. The circuit of claim 1, wherein said periodic oscillating signal has a maximum amplitude and wherein said second control signal causes said transistor to activate when said maximum amplitude occurs.

5. The circuit of claim 1, further comprising a DC supply voltage applied to said drain terminal and a DC bias voltage applied to said gate terminal for providing bias to said circuit.

6. The circuit of claim 5, wherein said inductor is connected between said supply voltage and said drain terminal for producing said periodic oscillating signal.

7. The circuit of claim 1, wherein said transistor comprises a first transistor, wherein said tank section comprises a first tank section, and wherein said periodic oscillating signal comprises a first periodic oscillating signal and a second periodic oscillating signal, said circuit further comprising:

a second transistor having a gate terminal, a source terminal, a drain terminal and a second threshold voltage value and being selectively activatable when a voltage difference between said second transistor gate and source terminals exceeds said second threshold voltage value;

a second DC current source connected to said second transistor source terminal for providing operating current to said circuit;

a second tank section having an inductor and third and fourth capacitors, said third and fourth capacitors of said second tank section being connected to each other and to said second transistor source terminal for supplying a third control signal to said second transistor source terminal;

said means further supplying a fourth control signal to said second transistor gate terminal, said means causing said fourth control signal to be at a high value when said second periodic oscillating signal is at a low value for activating said second transistor for a short duration to inject power into said second tank section.

8. The circuit of claim 7, wherein said fourth capacitor has a value larger than said third capacitor.

9. The circuit of claim 7, further comprising a DC supply voltage applied to said drain terminal and a DC bias voltage applied to said gate terminal for providing bias to said circuit.

10. The circuit of claim 9, wherein said inductor is connected between said supply voltage and said drain terminal for producing said periodic oscillating signal.

11. The circuit of claim 1, wherein said first tank section has an output node, said circuit further comprising a varactor connected between said output node and a common ground.

12. The circuit of claim 7, wherein said first tank section has an output node, said second tank section has an output node, and said circuit further comprising a varactor connected between said output nodes of said first and second tank sections.

13. An oscillator circuit for producing a periodic oscillating signal which varies between periodically occurring maximum and minimum values and having increased signal power and a reduced phase noise, comprising:

- a transistor having a gate terminal, a source terminal, a drain terminal and a threshold voltage value and being selectively activatable when a voltage difference between said gate and source terminals exceeds said threshold voltage value;
- a DC current source connected to said source terminal for providing bias to said circuit;
- a tank section having an inductor and first and second capacitors, said capacitors being connected to each other and to said source terminal for supplying a first control signal to said source terminal; and
- means for activating said transistor for a short duration of time to coincide with the occurrence of the maximum value of the periodic oscillating signal for injecting power to the periodic oscillating signal when said transistor is activated.

14. The circuit of claim 13, wherein said inductor comprises a first inductor and wherein said activating means comprises a second inductor connected to said gate terminal and electromagnetically coupled to said first inductor.

15. The circuit of claim 13, wherein said transistor comprises a first transistor, wherein said tank section comprises a first tank section, and wherein said periodic oscillating signal comprises a first periodic oscillating signal and a second periodic oscillating signal, said circuit further comprising:

- a second transistor having a gate terminal, a source terminal, a drain terminal and a second threshold voltage value and being selectively activatable when a voltage difference between said second transistor gate and source terminals exceeds said second threshold voltage value;
- a second DC current source connected to said second transistor source terminal for providing bias to said circuit;
- a second tank section having an inductor and third and fourth capacitors, said third and fourth capacitors of said second tank section being connected to each other and to said second transistor source terminal for supplying a third control signal to said second transistor source terminal;
- said means further supplying a fourth control signal to said second transistor gate terminal, said means causing said fourth control signal to be at a high value when said second periodic oscillating signal is at a low value for activating said second transistor for a short duration to inject power into said second tank section.

* * * * *